(12) United States Patent
Chang et al.

(10) Patent No.: US 7,559,004 B1
(45) Date of Patent: *Jul. 7, 2009

(54) DYNAMIC REDUNDANT AREA CONFIGURATION IN A NON-VOLATILE MEMORY SYSTEM

(75) Inventors: Robert C Chang, Danville, CA (US); Bahman Qawami, San Jose, CA (US); Farshid Sabet-Sharghi, San Jose, CA (US)

(73) Assignee: SanDisk Corporation, Sunnyvale, CA (US)

( * ) Notice: Subject to any disclaimer, the term of this patent is extended or adjusted under 35 U.S.C. 154(b) by 993 days.

This patent is subject to a terminal disclaimer.

(21) Appl. No.: 10/676,407

(22) Filed: Oct. 1, 2003

(51) Int. Cl.
*H03M 13/00* (2006.01)
(52) U.S. Cl. .................. 714/758; 714/774; 714/708
(58) Field of Classification Search ............. 714/758, 714/774, 708
See application file for complete search history.

(56) References Cited

U.S. PATENT DOCUMENTS

| | | | |
|---|---|---|---|
| 4,785,452 A | 11/1988 | Petz et al. | |
| 5,222,109 A | 6/1993 | Pricer | 377/24.1 |
| 5,228,046 A | 7/1993 | Blake et al. | |
| 5,297,148 A | 3/1994 | Harari et al. | 371/10.2 |
| 5,388,083 A | 2/1995 | Assar et al. | 365/218 |
| 5,438,573 A | 8/1995 | Mangan et al. | 371/10.3 |
| 5,568,439 A | 10/1996 | Harari | 365/218 |
| 5,598,370 A | 1/1997 | Niijima et al. | 365/185.33 |
| 5,603,001 A | 2/1997 | Sukegawa et al. | |
| 5,699,365 A * | 12/1997 | Klayman et al. | 714/708 |
| 5,754,565 A | 5/1998 | Mo et al. | |
| 5,835,935 A | 11/1998 | Estakhri et al. | 711/103 |
| 5,845,313 A | 12/1998 | Estakhri et al. | 711/103 |
| 5,860,082 A | 1/1999 | Smith et al. | 711/103 |
| 5,907,856 A | 5/1999 | Estakhri et al. | 711/103 |
| 5,924,113 A | 7/1999 | Estakhri et al. | 711/103 |
| 5,956,743 A | 9/1999 | Bruce et al. | |
| 5,961,660 A | 10/1999 | Capps, Jr. et al. | |
| 6,000,006 A | 12/1999 | Bruce et al. | |
| 6,016,275 A | 1/2000 | Han | 365/185.29 |

(Continued)

FOREIGN PATENT DOCUMENTS

JP   62-283496   12/1987

(Continued)

OTHER PUBLICATIONS

Kim, Jesung et al., "A Space-Efficient Flash Translation Layer for Compactflash Systems", IEEE Transactions on Consumer Electronics, vol. 48, No. 2, May 2002.

*Primary Examiner*—Guy J Lamarre
(74) *Attorney, Agent, or Firm*—Brinks Hofer Gilson & Lione

(57) ABSTRACT

Methods and apparatus for dynamically configuring a redundant area of a physical page are disclosed. According to one aspect of the present invention, a method for dynamically configuring a redundant area of a page associated with a physical block of a non-volatile memory of a memory system includes determining when at least one byte associated with the redundant area is to be altered. The byte includes error correction code (ECC) information associated with a first ECC algorithm at the time of the determination. The method also includes altering the byte when it is determined that the byte is to be altered. Altering the byte includes altering the byte to include ECC information associated with a second ECC algorithm.

31 Claims, 8 Drawing Sheets

U.S. PATENT DOCUMENTS

| | | |
|---|---|---|
| 6,041,001 A | 3/2000 | Estakhri |
| 6,081,447 A | 6/2000 | Lofgren et al. ......... 365/185.02 |
| 6,085,339 A | 7/2000 | Jeddeloh |
| 6,115,785 A | 9/2000 | Estakhri et al. ............. 711/103 |
| 6,125,435 A | 9/2000 | Estakhri et al. ............. 711/201 |
| 6,182,239 B1 | 1/2001 | Kramer |
| 6,230,233 B1 | 5/2001 | Lofgren et al. ............. 711/103 |
| 6,260,156 B1 | 7/2001 | Garvin et al. ................. 714/8 |
| 6,353,910 B1 | 3/2002 | Carnevale et al. |
| 6,426,893 B1 | 7/2002 | Conley et al. ......... 365/185.11 |
| 6,487,685 B1 | 11/2002 | Fiske et al. |
| 6,747,827 B1 | 6/2004 | Bassett et al. |
| 6,961,890 B2 | 11/2005 | Smith |
| 6,970,890 B1 | 11/2005 | Bruce et al. |
| 7,287,118 B2 * | 10/2007 | Chang et al. ................. 711/103 |
| 2001/0029564 A1 | 10/2001 | Estakhri et al. |
| 2001/0042230 A1 | 11/2001 | Williams et al. |
| 2002/0008928 A1 | 1/2002 | Takahashi |
| 2002/0032891 A1 | 3/2002 | Yada et al. |
| 2003/0099140 A1 | 5/2003 | Payne et al. |
| 2003/0227804 A1 * | 12/2003 | Lofgren et al. .............. 365/200 |
| 2004/0015674 A1 * | 1/2004 | Lakhani et al. ............. 711/206 |
| 2004/0083333 A1 | 4/2004 | Chang et al. |
| 2004/0083334 A1 | 4/2004 | Chang et al. |
| 2004/0228197 A1 | 11/2004 | Mokhlesi |

FOREIGN PATENT DOCUMENTS

| | | |
|---|---|---|
| JP | 62-283497 | 12/1987 |

* cited by examiner

US 7,559,004 B1

DYNAMIC REDUNDANT AREA CONFIGURATION IN A NON-VOLATILE MEMORY SYSTEM

CROSS REFERENCE TO RELATED APPLICATIONS

The present invention is related to co-pending U.S. patent application Ser. Nos. 10/281,739, 10/281,823, 10/281,670, 10/281,824, 10/281,631, 10/281,855, 10/281,762, 10/281,696, 10/281,626, and 10/281,804, as well as U.S. Provisional Patent Application Nos. 60/421,910, 60/421,725, 60/421,965, 60/422,166, 60/421,746, and 60/421,911, each filed on Oct. 28, 2002, which are each incorporated herein by reference in their entireties.

BACKGROUND OF THE INVENTION

1. Field of Invention

The present invention relates generally to mass digital data storage systems. More particularly, the present invention relates to systems and methods for enabling an error correction scheme to be dynamically changed by allowing error correction codes stored in a redundant area associated with a physical block to be dynamically altered.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Often, in order to assure the accuracy of data stored in physical blocks of a flash memory, an error correction code (ECC) algorithm, or an error checking and correction code algorithm, may be used to encode data for storage, and to decode the stored data. Typically, ECC algorithms use dedicated circuitry or software to encode and to decode the data. Many ECC algorithms or methods may add a parity bit or parity bits which may be used to both detect and to correct errors associated with stored data. Such parity bits may be added in redundant areas associated with physical blocks.

FIG. 1 is a diagrammatic representation of a redundant area of a page of a physical block. A physical block 200 includes pages 204. A page 204a, which is generally representative of pages 204a-h, has a data area 208 that contains user data and a redundant area 212. Data area 208 often includes approximately 512 or more bytes, while redundant area 212 often includes approximately sixteen or more bytes. Redundant area 212 generally includes information such as a logical block address 220 for a logical block (not shown) that is associated with physical block 200 and ECC bits 224. ECC bits 224, which may occupy approximately eight bytes in redundant area 212, are used to encode and to decode data contained in data area 208 and portions of redundant area 212. It should be appreciated that redundant area 212 also includes other information 216.

Some ECC algorithms that are used to encode and to decode data for storage are known as 1-bit ECC algorithms, 2-bit ECC algorithms, and 2-symbol ECC algorithms. 1-bit ECC algorithms enable a set of symbols to be represented such that if one bit of the representation is incorrect, e.g., is flipped, the bits will be corrected, and if two bits are incorrect, e.g., are flipped, the bits may still be correctly identified. 2-bit ECC algorithms enable a set of symbols to be represented such that if two bits of the representation are flipped or otherwise incorrect, the two bits will be corrected, and if more than two bits are flipped, the bits may still be correctly identified. 2-symbol ECC algorithms may be used to such that when two symbols which are each made up of five bits include incorrect bits, as for example bits that are flipped, those two symbols may be correctly identified. The use of 2-symbol ECC algorithms allows for up to ten incorrect bits to be corrected, when the ten incorrect bits are located in two symbols.

In general, the use of a 2-bit ECC algorithm may be preferred to a 1-bit ECC algorithm due to the ability to of a 2-bit ECC algorithm to detect more than two bad bits and to correct two bits, while a 1-bit ECC algorithm may detect two bad bits and to correct one bit. The use of a 2-symbol ECC algorithm may be preferred to a 2-bit ECC algorithm because of the ability to correct up to ten incorrect bits in some cases. However, the implementation of a 2-symbol ECC algorithm, while providing increased error correction capabilities to stored data, generally involves more calculations and, hence, more computational overhead than the implementation of a 2-bit ECC algorithm. Similarly, the implementation of a 2-bit ECC algorithm may also use more computational overhead than the implementation of a 1-bit ECC algorithm. When more computational overhead is required, more power, e.g., battery power, may be consumed by a non-volatile memory. As a result, the overall performance of a memory system may be compromised, particularly since the integrity of data that is stored in blocks which have been erased a relatively low number of times is generally relatively high.

To reduce the computational and power requirements associated with implementing 2-bit ECC and 2-symbol ECC algorithms, some systems may use 1-bit ECC algorithms to encode and to decode data. 1-bit ECC algorithms, however, are often less accurate than 2-bit ECC and 2-symbol ECC algorithms. Further, as blocks into which data is stored near the end of their usable lives, the data stored in such blocks is more likely to contain errors. As such, when 1-bit ECC algorithms are used to encode data stored in blocks which have been erased a relatively high number of times and to decode such data, the integrity of the data may be compromised, and the performance associated with the blocks may be adversely affected.

Therefore, what is needed is a method and an apparatus which enables the performance of blocks which have been erased a relatively high number of times to be improved without requiring relatively high computational overhead and performance penalties to encode and to decode data which are stored in blocks that have been erased a relatively low number of times. That is, what is desired is a method and an apparatus that enables contents of blocks to be encoded using different ECC algorithms which may be dynamically configured such that the ECC algorithm may be changed depending upon how many times the blocks have been erased.

SUMMARY OF THE INVENTION

The present invention relates to a system and a method that allows a redundant area of a physical page to be dynamically configured. According to one aspect of the present invention, a method for dynamically configuring a redundant area of a page associated with a physical block of a non-volatile memory of a memory system includes determining when at least one byte associated with the redundant area is to be altered. The byte includes error correction code (ECC) information associated with a first ECC algorithm at the time of the determination. The method also includes altering the byte when it is determined that the byte is to be altered. Altering the byte includes altering the byte to include ECC information associated with a second ECC algorithm. In one embodiment, the first ECC algorithm is a 1-bit ECC algorithm and the second ECC algorithm is a 2-symbol ECC algorithm.

By enabling a redundant area associated with a block to be dynamically configured, the ease with which the block may be associated with a new ECC algorithm is improved. A 1-bit ECC algorithm, or a less calculation-intensive algorithm, may be used to encode data that is to be stored into the block when the block has not been through a relatively high number of erase operations, while a 2-symbol ECC algorithm, or more generally a more calculation-intensive algorithm, is used to encode data that is to be stored into the block when the block has been through a relatively high number of erase operations. The ability to dynamically configure a redundant area of the block allows ECC bits used for a 1-bit ECC algorithm to be efficiently switched to ECC bits used for a 2-symbol ECC algorithm when, during the course of using the block, it is determined to be beneficial to make such a switch.

According to another aspect of the present invention, a method for processing a page associated with a physical block of a non-volatile memory of a memory system includes determining when at least one byte, which is stored in a redundant area of the page, associated with a first ECC algorithm is to be altered to be associated with a second ECC algorithm. The method also includes dynamically configuring the redundant area when it is determined that the byte is to be altered such that the byte is altered to be associated with the second ECC algorithm. In one embodiment, the first ECC algorithm is a 1-bit ECC algorithm and the second ECC algorithm is a 2-symbol ECC algorithm.

In another embodiment, determining when the byte is to be altered includes determining when an indicator stored in the redundant area indicates that the byte is to be altered. In such an embodiment, the indicator is arranged to indicate a number of times the physical block has been erased, and when the indicator is approximately equal to a predetermined value, the indicator indicates that the byte is to be altered.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which:

FIG. 2b is a diagrammatic representation a memory device, e.g., memory device 120 of FIG. 2a.

DETAILED DESCRIPTION OF THE EMBODIMENTS

Figure 1:
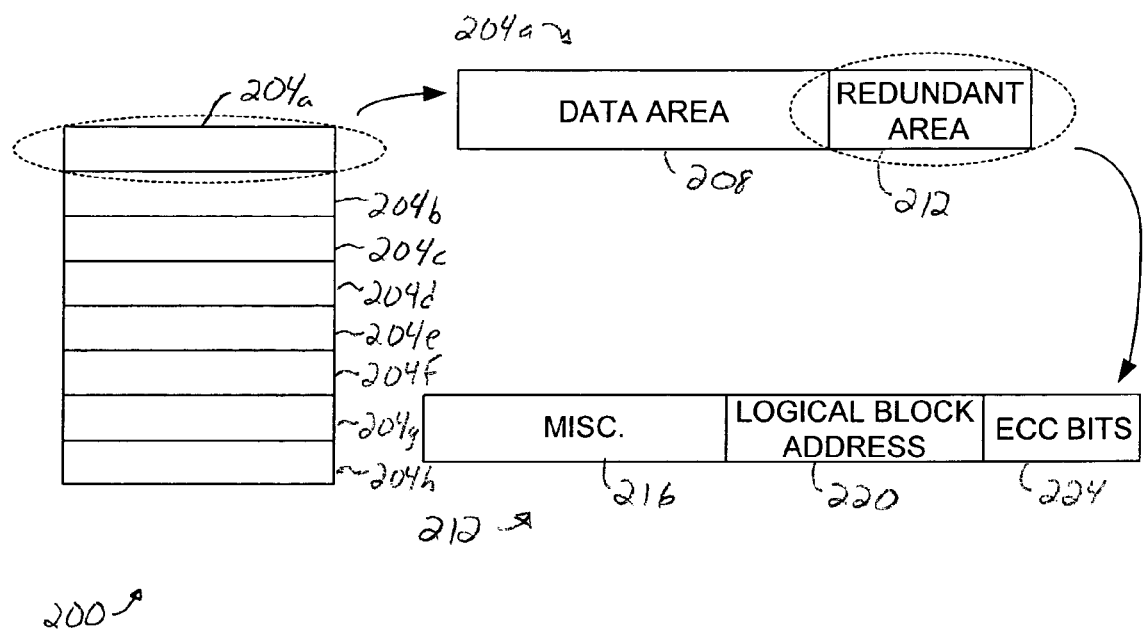
FIG. 1 is a diagrammatic representation of a redundant area of a page of a physical block.

In many cases, when a block into which data is stored is relatively young and, hence, has not been subjected to a relatively high number of erase cycles, a 1-bit ECC algorithm may be sufficient to ensure the integrity of much of the data. As such, the implementation of a more accurate ECC algorithm such as a 2-symbol ECC algorithm to encode and to decode data may not be necessary. However, as a block gets older and has been subjected to a relatively high number of erase cycles, a 1-bit ECC algorithm may not be sufficient to ensure a desired level of data integrity, and the use of a 2-symbol ECC algorithm to encode and to decode data may significantly improve the integrity of the data.

A hybrid ECC implementation enables ECC algorithms used to encode and to decode data to be dynamically switched, as described in U.S. Patent Application No. 60/421, 911, which has been incorporated by reference. Data stored in blocks which have undergone a relatively low number of erase cycles may be encoded using a less calculation-intensive and less accurate algorithm, e.g., a 1-bit ECC algorithm, while blocks which have undergone a relatively high number of erase cycles may be encoded using a more calculation-intensive and more accurate algorithm, e.g., a 2-bit ECC algorithm or a 2-symbol ECC algorithm. By dynamically determining when data is to be encoded using a more accurate algorithm such as a 2-bit ECC algorithm or a 2-symbol ECC algorithm instead of a "default" algorithm, e.g., a less accurate algorithm such as a 1-bit ECC algorithm, the algorithm chosen to encode data to be stored in a particular block may be selected depending upon characteristics of the particular block, and the more accurate algorithm may effectively be used when it would provide a substantial benefit. For example, if a block is nearing the end of its projected usable life, using a 2-symbol ECC algorithm to encode data to be stored into the block may improve the accuracy or integrity of the data stored in the block, and may also allow the usable life of the block to be potentially extended. Further, by using a less calculation-intensive algorithm to encode data to be stored in blocks which are not nearing the end of their usable lives, the power requirements of an overall memory system may be reduced, thereby improving the endurance of the overall memory system.

By allowing bits stored in ECC bytes within a redundant area of a page associated with a block to be dynamically configured or reconfigured, a hybrid ECC implementation may be efficiently implemented. The ability to dynamically configure the redundant area of a page associated with a block also generally allows an error correction method associated with the block to be switched at substantially any time. In addition, when a redundant area in general may be dynamically configured, an overall system which uses the redundant area may operate more efficiently, as updated information is readily accessible. That is, a dynamically configurable redundant area allows ECC codes to be readily changed, and also allows various other information to be dynamically updated. For example, a bit or bits in the redundant area may be dynamically altered to enable it to be readily identified whether the corresponding physical block is associated with a top half or a bottom half of a logical block when the logical block is split. The splitting of logical blocks is described in co-pending U.S. patent application Ser. No. 10/281,631, which has been incorporated by reference.

Figure 2A:
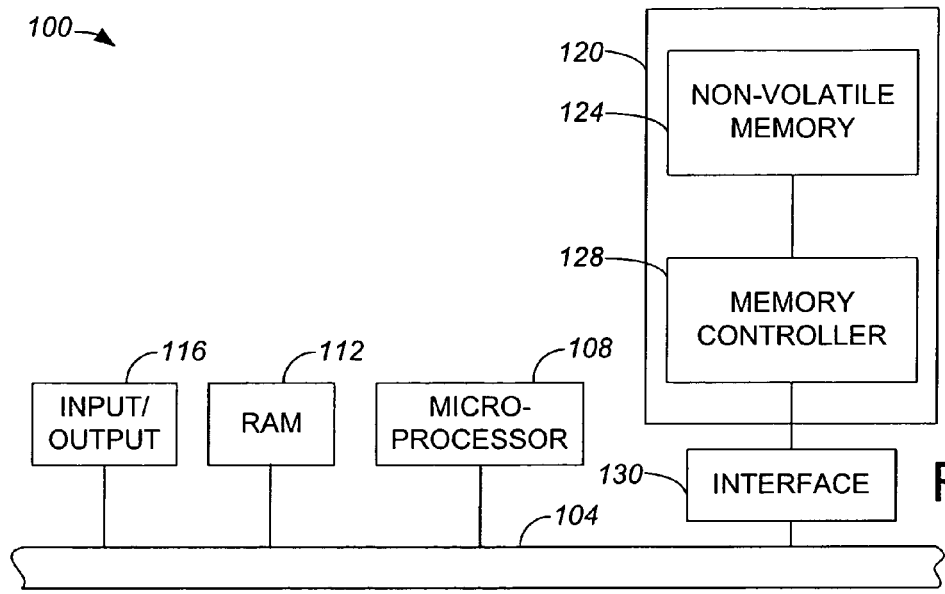
FIG. 2a is a diagrammatic representation of a general host system which includes a non-volatile memory.

Flash memory systems or, more generally, non-volatile memory devices which allows ECC bits in a redundant area associated with a physical block to be dynamically configured generally include flash memory cards and chip sets. Typically, flash memory systems are used in conjunction with a host system such that the host system may write data to or read data from the flash memory systems. However, some flash memory systems include embedded flash memory and software which executes on a host to substantially act as a controller for the embedded flash memory, as will be discussed below with respect to FIG. 2c. Referring to FIG. 2a, a general host system which includes a non-volatile memory device, e.g., a CompactFlash memory card or substantially any type of memory card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, or a video player. It should be appreciated, however, that host system 100 may generally be substantially any system which stores data or information, and retrieves data or information.

Host system 100 may also be a system which either only captures data, or only retrieves data. That is, host system 100 may be, in one embodiment, a dedicated system which stores data, or host system 100 may be a dedicated system which reads data. By way of example, host system 100 may be a memory writer which is arranged only to write or store data. Alternatively, host system 100 may be a device such as an MP3 player which is typically arranged to read or retrieve data, and not to capture data.

A non-volatile memory device 120 which, in one embodiment, is a removable non-volatile memory device, is arranged to interface with bus 104 to store information. An optional interface block 130 may allow non-volatile memory device 120 to interface indirectly with bus 104. When present, input/output circuit block 116 serves to reduce loading on bus 104, as will be understood by those skilled in the art. Non-volatile memory device 120 includes non-volatile memory 124 and an optional memory control system 128. In one embodiment, non-volatile memory device 120 may be implemented on a single chip or a die. Alternatively, non-volatile memory device 120 may be implemented on a multi-chip module, or on multiple discrete components which may form a chip set and may be used together as non-volatile memory device 120. One embodiment of non-volatile memory device 120 will be described below in more detail with respect to FIG. 1b.

Non-volatile memory 124, e.g., flash memory such as NAND flash memory, is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128 or, when memory control system 128 is not present, by software executed by microprocessor 108. The operation of non-volatile memory 124 may be managed such that the lifetime of non-volatile memory 124 is substantially maximized by essentially causing sections of non-volatile memory 124 to be worn out substantially equally.

Non-volatile memory device 120 has generally been described as including an optional memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art. Alternatively, the functionality of memory control system 128 may be provided by microprocessor 108, as for example in an embodiment in which non-volatile memory device 120 does not include memory controller 128, as discussed above.

Figure 2B:
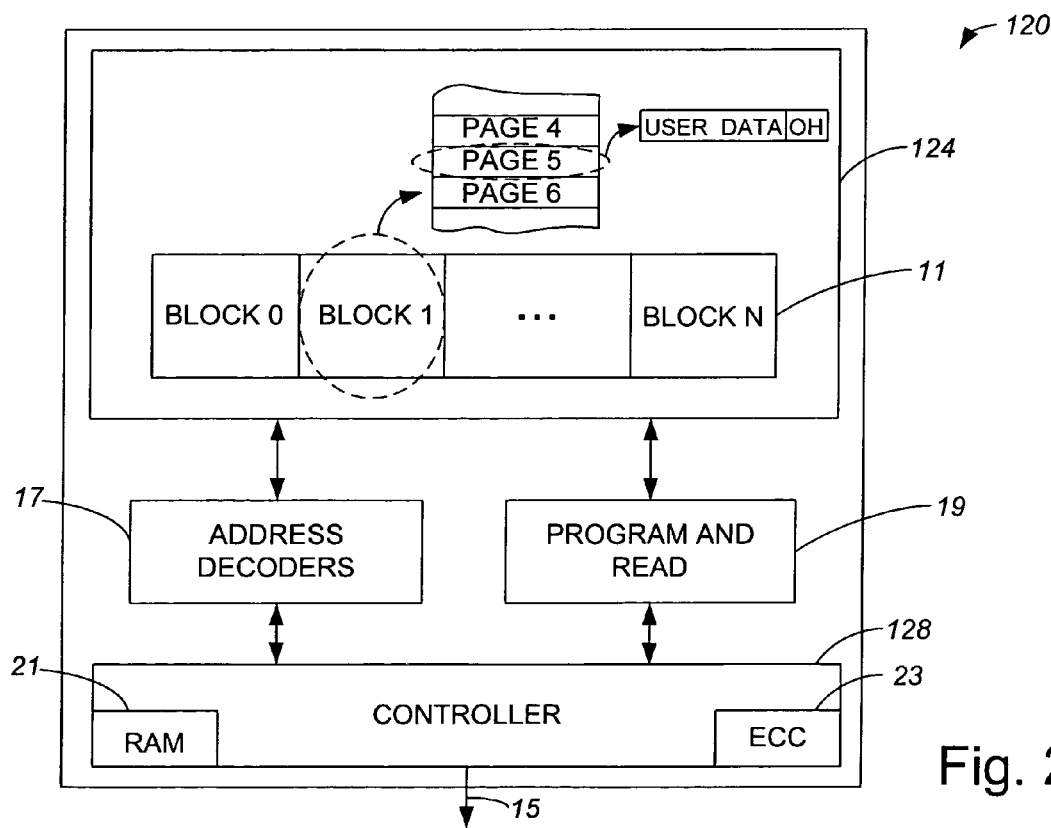

With reference to FIG. 2b, non-volatile memory device 120 will be described in more detail in accordance with an embodiment of the present invention. As described above, non-volatile memory device 120 includes non-volatile memory 124 and may include memory control system 128. Memory 124 and control system 128, or controller, may be primary components of non-volatile memory device 120, although when memory 124 is an embedded NAND device, for example, non-volatile memory device 120 may not include control system 128. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

When present, control system 128 communicates over a bus 15 to a host computer or other system that is using the memory system to store data. Bus 15 is generally a part of bus 104 of FIG. 2a. Control system 128 also controls operation of memory 124, which may include a memory cell array 11, to write data provided by the host, read data requested by the host and perform various housekeeping functions in operating memory 124. Control system 128 generally includes a general purpose microprocessor which has associated non-volatile software memory, various logic circuits, and the like. One or more state machines are often also included for controlling the performance of specific routines.

Memory cell array 11 is typically addressed by control system 128 or microprocessor 108 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0-N memory cells. As is common for flash EEPROM systems, the block is typically the smallest unit of erase. That is, each block contains the minimum number of memory cells that are erased together. Each block is typically divided into a number of pages. As will be appreciated by those skilled in the art, a page may be the smallest unit of programming. That is, a basic programming operation writes data into or reads data from a minimum of one page of memory cells. One or more sectors of data are typically stored within each page. As shown in FIG. 2*b*, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs are stored in different pages, or different blocks, than the user data to which they pertain.

A sector of user data is typically 512 bytes, corresponding to the size of a sector in magnetic disk drives. Overhead data, or redundant data, is typically an additional 16 bytes. One sector of data is most commonly included in each page but two or more sectors may instead form a page. Any number of pages may generally form a block. By way of example, a block may be formed from eight pages up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

In one embodiment, non-volatile memory is embedded into a system, e.g., a host system. Flash memory chip sets generally include flash memory components and a controller component. Typically, a flash memory chip set may be arranged to be assembled into an embedded system. The manufacturers of such assemblies or host systems typically acquire flash memory in component-form, as well as other components, then assemble the flash memory and the other components into a host system.

Figure 2C:
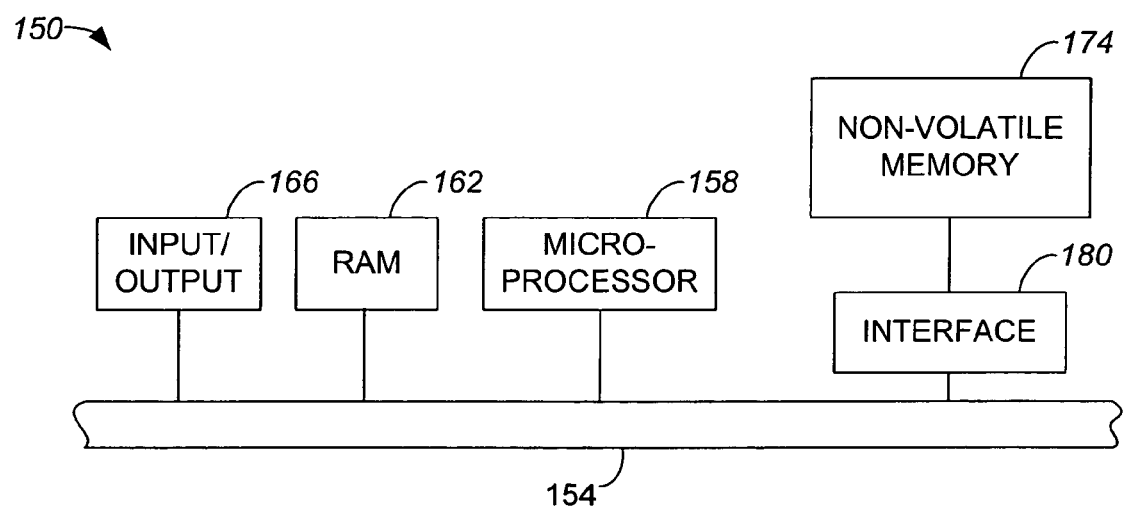
FIG. 2c is a diagrammatic representation of a host system which includes an embedded non-volatile memory.

FIG. 2*c* is a diagrammatic representation of a host system which includes an embedded non-volatile memory. A host or computer system 150 generally includes a system bus 154 which allows a microprocessor 158, a RAM 162, and input/output circuits 166, among other components (not shown) of host system 150, to communicate. A non-volatile memory 174, e.g., a flash memory, allows information to be stored within host system 150. An interface 180 may be provided between non-volatile memory 174 and bus 154 to enable information to be read from and written to non-volatile memory 174.

Non-volatile memory 174 may be managed by microprocessor 158 which effectively executes either or both software and firmware which is arranged to control non-volatile memory 174. That is, microprocessor 158 may run code devices (not shown), i.e., software code devices or firmware code devices, which allow non-volatile memory 174 to be controlled. Such code devices, which may be a flash memory packaged with CPU inside microprocessor 158, a separate flash ROM, or inside non-volatile memory 174, which will be described below, may enable physical blocks in non-volatile memory 174 to be addressed, and may enable information to be stored into, read from, and erased from the physical blocks.

Figure 3:
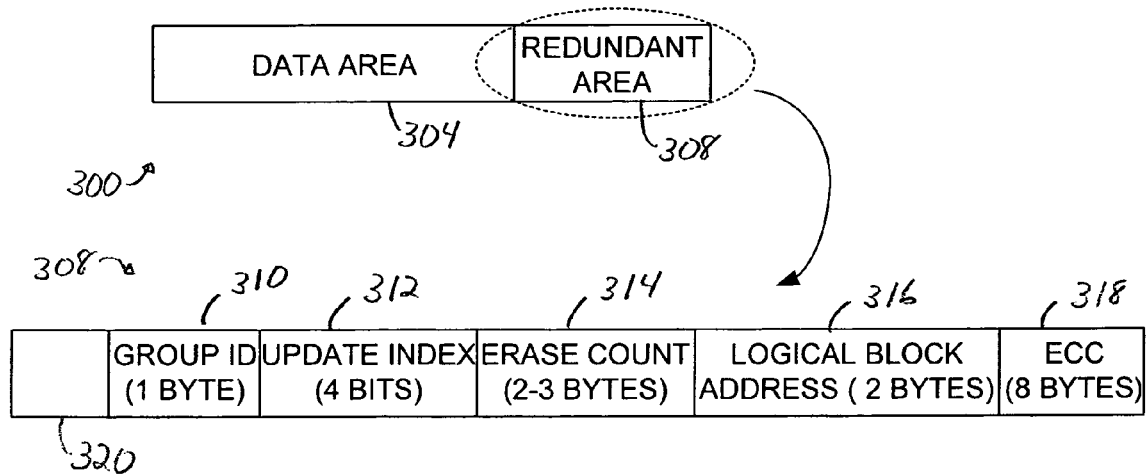
FIG. 3 is a diagrammatic representation of a page of a physical block in accordance with an embodiment of the present invention.

FIG. 3 is a diagrammatic representation of a page of a physical block which includes a data area and a redundant area in accordance with an embodiment of the present invention. A page 300 has a data area 304 and a redundant area 308 which may be dynamically configured. Redundant area 308 includes a group identifier 310, which occupies approximately one byte, and identifies a group to which page 300 belongs. Group identifiers are described in co-pending U.S. patent application Ser. No. 10/281,855, which has been incorporated by reference. Redundant area 308 also includes an update index 312, which may occupy approximately four bits, that is arranged to indicate if the physical block (not shown) which includes page 300 is more "recent" than another physical block. In other words, update index 312 may be used to indicate whether page 300 is a part of a physical block which is being written to and will be associated with a logical block, or a part of a physical block which is to be erased. Update indexes are described in co-pending U.S. patent application Ser. No. 10/281,762, which has been incorporated by reference.

An erase count 314, which occupies approximately two to three bytes in redundant area 308, is arranged to indicate how many times the physical block (not shown) of which page 300 is a part has been erased. Erase counts 314 are described in co-pending U.S. patent application Ser. No. 10/281,696, which has been incorporated by reference. Redundant area 308 also includes a logical block address 316 of a logical block that is associated with the physical block (not shown) of which page 300 is a part. Logical block address 316 may be stored in approximately two bytes of redundant area 308.

Figure 4A:
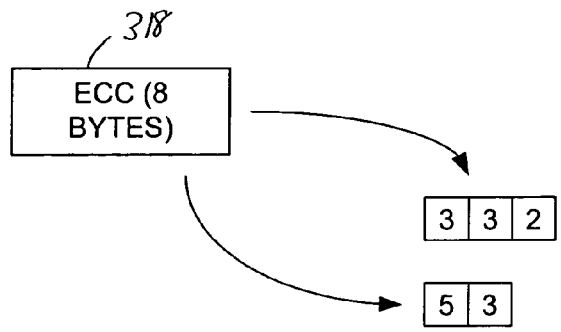
FIG. 4a is a diagrammatic representation of ECC bits, e.g., ECC bits 318 of FIG. 3, in accordance with an embodiment of the present invention.

ECC bits 318 are stored in approximately eight bytes of redundant area 308, and substantially any other information, as for example a flag (not shown), that is to be stored in redundant area 308 may be stored in remaining bits 320. ECC bits 318 may be substantially partitioned into groups of any number of bits. For example, as shown in FIG. 4*a*, ECC bits 318 may be substantially divided such that ECC bits 318 are stored as three bytes, three bytes, and two bytes. Such a division may be particularly suitable for use in a 1-bit error correction method, as will be discussed below with respect to FIG. 4*b*. Alternatively, ECC bits 318 may be substantially divided such that ECC bits 318 are stored as five bytes and three bytes. The division of ECC bits 318 into five bytes and three bytes may be particularly suitable for use in a 2-symbol error correction method, as will be discussed below with reference to FIG. 4c.

Figure 4B:
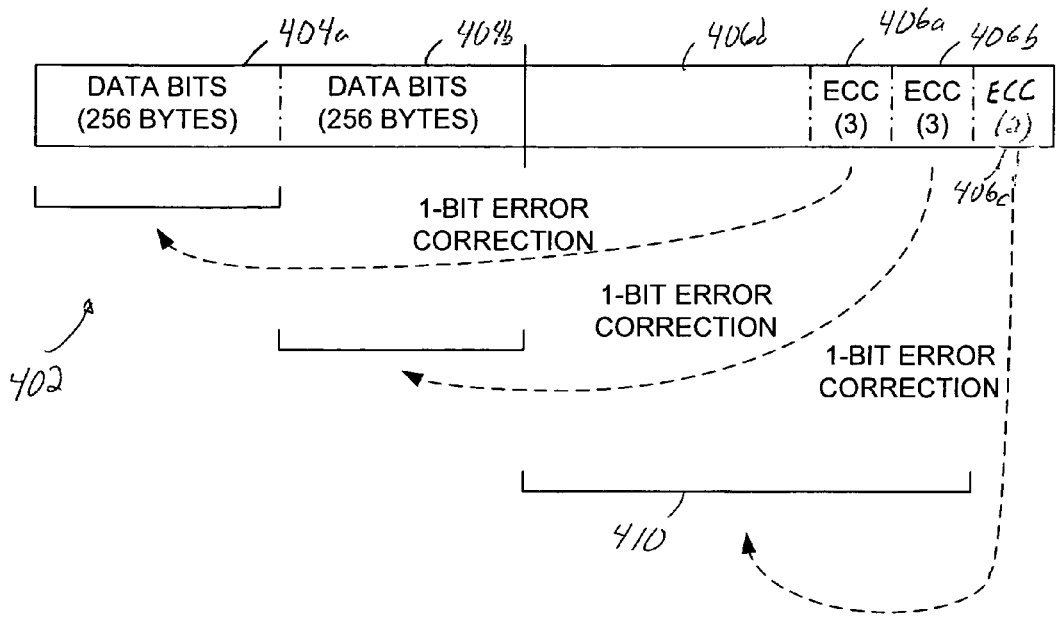
FIG. 4b is a diagrammatic representation of a page that is configured with ECC bits that are arranged to support 1-bit error correction in accordance with an embodiment of the present invention.

When ECC bits 318 are stored as three bytes, three bytes, and two bytes, the first three bytes may generally be arranged to correct a single bit error in the first 256 bytes of a data area, e.g., data area 304 of FIG. 3, while the second three bytes may generally be used to correct a single bit error in the second 256 bytes of the data area. As shown in FIG. 4b, approximately three bytes of ECC bits 406a are used to perform 1-bit error correction on data bits 404a of page 402, while approximately three bytes of ECC bits 406b are used to perform 1-bit error correction on data bits 404b. Approximately two bytes of ECC bits 406c are used to perform 1-bit error correction on substantially all of redundant area 406 except for the approximately two bytes of ECC bits 406c, as indicated at 410.

Figure 4C:
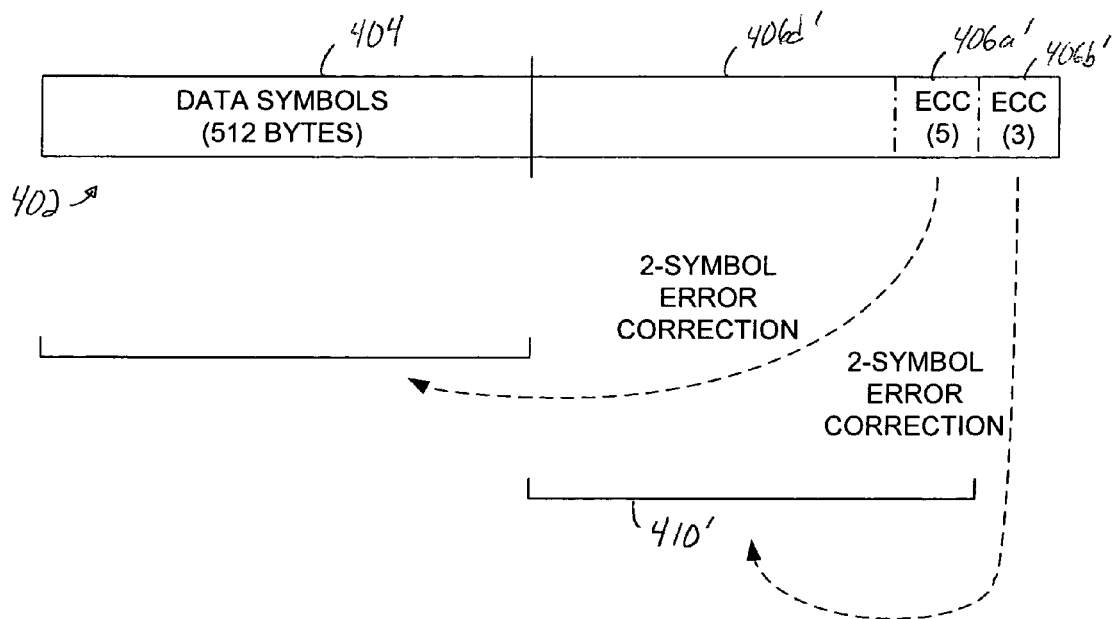
FIG. 4c is a diagrammatic representation of a page, i.e., page 402 of FIG. 4b, after the page has been dynamically configured such that ECC bits are arranged to support 2-symbol error correction in accordance with an embodiment of the present invention.

In one embodiment, ECC bits 406a-c are configured such that 1-bit error correction is performed when the physical block (not shown) associated with page 402 is relatively young. Once the physical block (not shown) is considered to be relatively old, e.g., has an erase count that is greater than or equal to a particular threshold value, then ECC bits 406a-c in overall redundant area 406 may be dynamically configured to perform 2-symbol error correction instead of 1-bit error correction. That is, ECC bits 406a-c may effectively be redistributed or changed from being configured in a three byte, three byte, and two byte arrangement to a five byte and three byte arrangement. FIG. 4c is a diagrammatic representation of a page, i.e., page 402 of FIG. 4b, after the page has been dynamically configured such that ECC bits are arranged to support 2-symbol error correction in accordance with an embodiment of the present invention. Redundant area 406' includes five bytes of ECC bits 406a' which are arranged to be used to perform 2-symbol error correction on substantially an entire data area 404 of page 402. Three bytes of ECC bits 406b' are used to perform 2-symbol error correction on the remainder of redundant area 406' with the exception of three bytes of ECC bits 406b', as indicated at 410'.

Dynamically altering ECC bits stored in the redundant area of a page such that the grouping of bits us changed allows the error correction method applied to the page to be efficiently changed. Hence, it is relatively efficient to provide for a relatively low overhead but less accurate error correction method for a page when an associated physical block is relatively young, or less likely to contain errors, and to provide for a higher overhead but more accurate error correction method for the page when the associated physical block is older, or more likely to contain errors.

Figure 5:
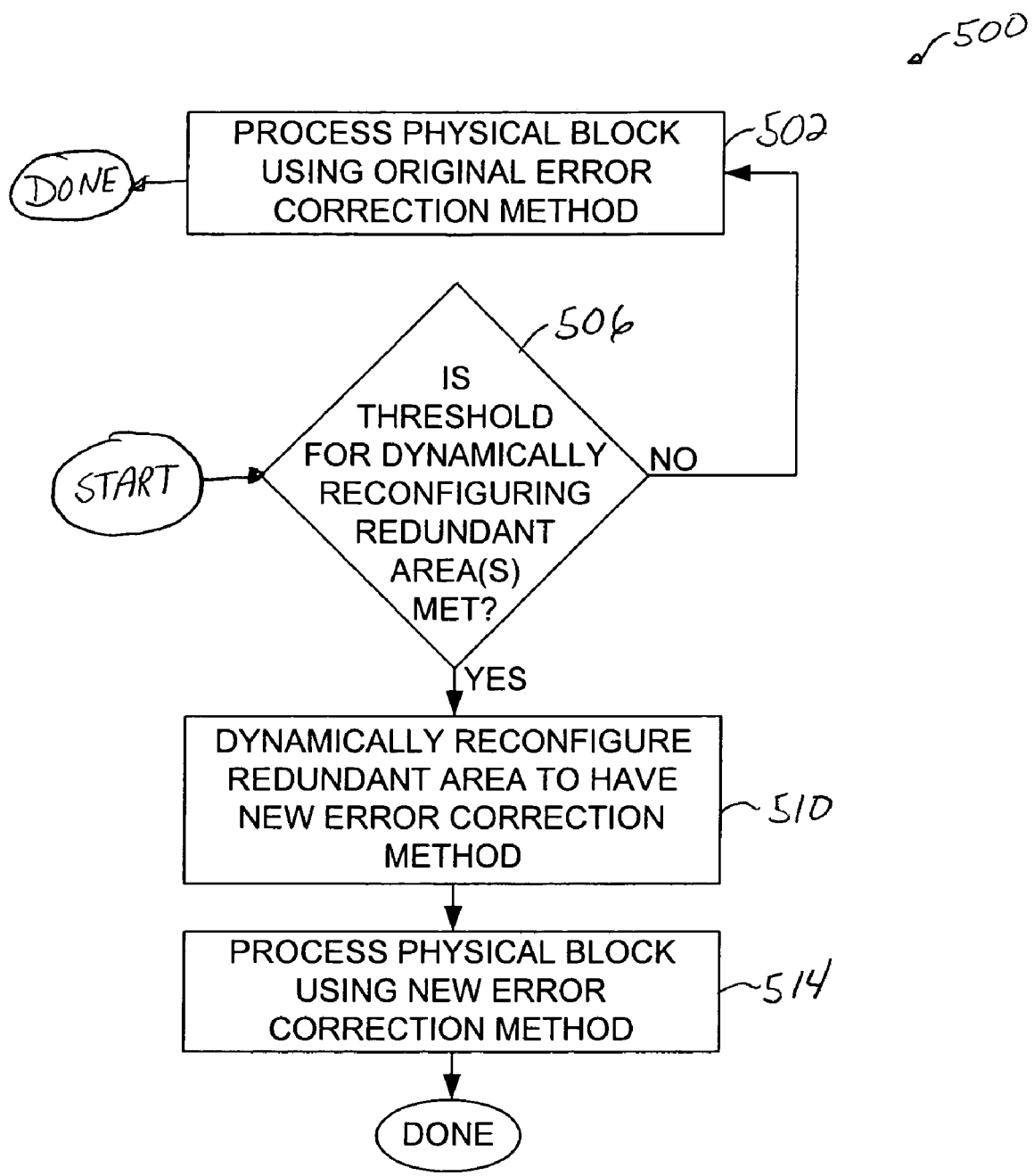
FIG. 5 is a process flow diagram which illustrates one method of performing error correction in a physical block for which an error correction method may be dynamically selected in accordance with an embodiment of the present invention.

FIG. 5 is a process flow diagram which illustrates one method of performing error correction in a physical block for which an error correction method may be dynamically selected in accordance with an embodiment of the present invention. A process 500 of performing error correction in a physical block begins at step 506 in which it is determined whether the threshold for dynamically reconfiguring a redundant area or areas associated with the physical block is met. In other words, it is determined if it is appropriate to dynamically reconfigure the redundant area or areas of the physical block and, hence, change the error correction method used to correct errors associated with the physical block. Such a determination may be based, for example, on whether it is determined that the likelihood of errors arising is increased. As previously mentioned, when the number of erase cycles associated with a physical block is relatively high, then the likelihood of errors arising is generally considered to be increased. In one embodiment, for a flash memory in which each physical block has an expected life of approximately one hundred thousand erase cycles, the threshold may be an erase count which is approximately equal to about sixty-five thousand erase cycles.

When it is determined in step 506 that the threshold for dynamically reconfiguring a redundant area or areas of the physical block is not met, then process flow moves to step 502 in which the physical block is processed using an original error correction method. The original error correction method may be substantially any suitable error correction method which encodes and decodes data associated with a page of the physical block, and uses ECC bits stored in a redundant area of the page associated with the physical block.

Alternatively, if it is determined in step 506 that the threshold is met, then the indication is that a new error correction method for used on the physical block is desired. Accordingly, in step 510, the redundant area or areas of the physical block are dynamically reconfigured to have a new, i.e., a second, error correction method. The new error correction method may use more computational resources than the original error correction method, but may be capable of correcting more bit errors than the original error correction method. As discussed above, dynamically reconfiguring the redundant area or areas of the physical block may include substantially redistributing ECC bits such that the grouping of the ECC bits is altered, e.g., from a three-three-two byte distribution to a five-three byte distribution. Once the redundant area or areas of the physical block are dynamically reconfigured, the physical block is processed in step 514 using the new error correction method. After the physical block is processed using the new error correction method, the process of performing error correction is completed.

Figure 6:
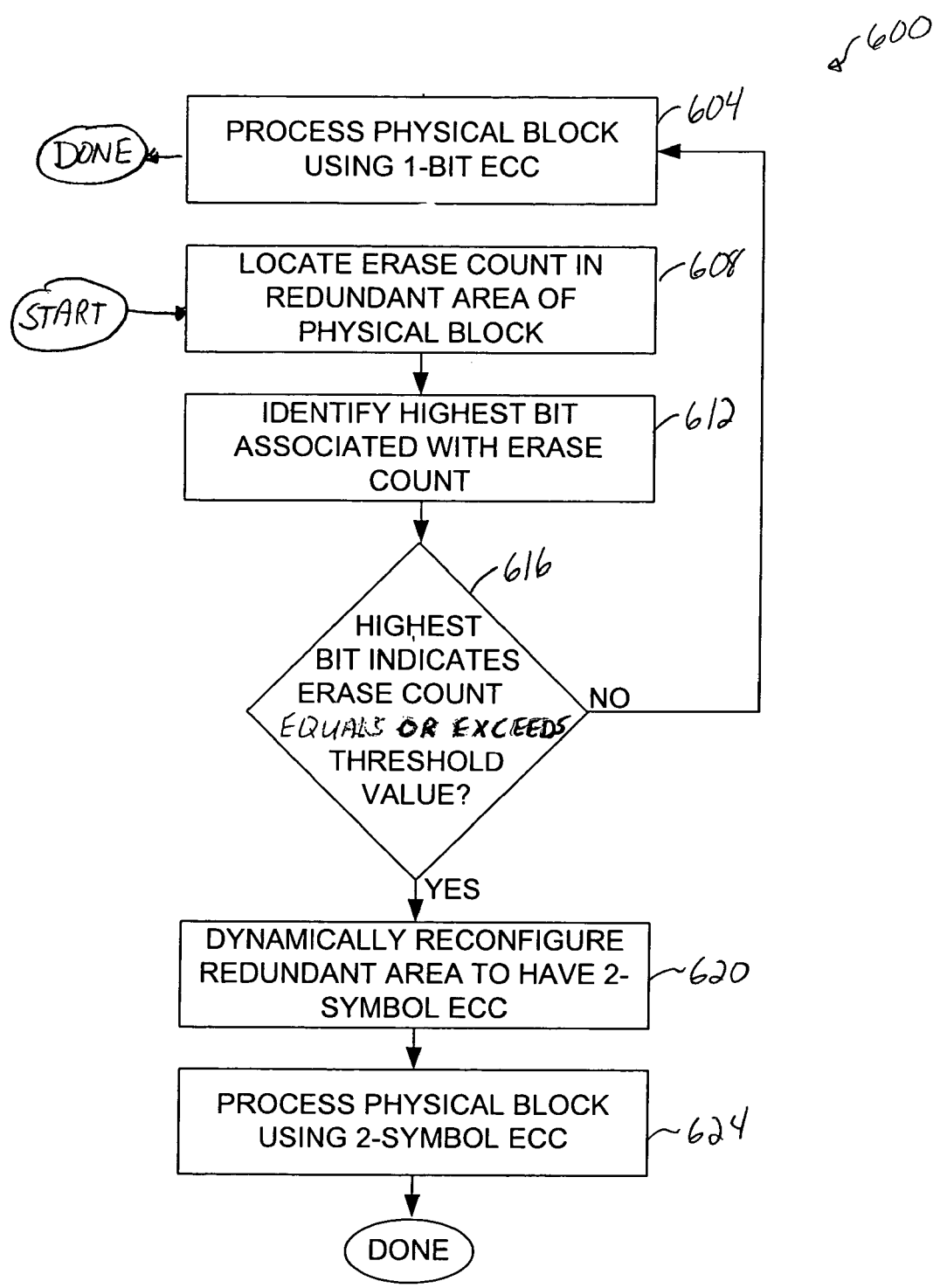
FIG. 6 is a process flow diagram which illustrates one method of performing error correction in a physical block for which an error correction method which uses 1-bit ECC may be dynamically changed to an error correction method which uses 2-symbol ECC will be described in accordance with an embodiment of the present invention.

Error correction methods which may be used to correct errors in pages of blocks may include, but are not limited to, methods which use 1-bit ECC and methods which use 2-symbol ECC. With reference to FIG. 6, one method of performing error correction in a physical block for which an error correction method which uses 1-bit ECC may be dynamically changed to an error correction method which uses 2-symbol ECC will be described in accordance with an embodiment of the present invention. A process 600 of performing error correction begins at step 608 in which an erase count associated with the physical block is located in the redundant area of the physical block. As previously mentioned, the erase count is arranged to indicate a number of times the physical block has been erased.

Once the erase count is located in the redundant area of the physical block, the highest bit associated with the erase count is identified in step 612. In one embodiment, the highest bit of two bytes used to store an erase count may identify whether the erase count exceeds a particular threshold, e.g., approximately thirty-two thousand, since the highest bit may be set to '1' to indicate that the erase count is greater than approximately thirty-two thousand. When the highest bit is set to '0,' then the remaining bits identify an erase count. On the other hand, when the highest bit is set to '1,' the remaining bits may effectively be the difference between an erase count and approximately thirty-two thousand. That is, when the highest bit is set to '1,' the remaining bits are effectively reset to zero and incremented each time the erase count increases.

After the highest bit associated with the erase count is identified, it is determined in step 616 whether the highest bit indicates that the erase count either equals or exceeds a threshold value, e.g., whether the highest bit indicates that the erase count is equal to or over approximately sixty-five thousand. When it is determined that the highest bit does not indicate that the erase count equals or exceeds the threshold value, process flow moves to step 604 in which a physical block is processed using 1-bit ECC, e.g., 1-bit ECC is used to correct errors associated with a physical block. Once the physical block is processed, the process of performing error correction is completed.

Alternatively, when it is determined in step 616 that the highest bit does indicate that the erase count equals or exceeds the threshold value, then the redundant area associated with the physical block is dynamically reconfigured to have 2-symbol ECC in step 620. It should be appreciated that substantially every redundant area associated with the physical block may be dynamically reconfigured to use 2-symbol ECC. Upon dynamically reconfiguring the redundant area to have 2-symbol ECC, the physical block is processed, e.g., encoded and decoded, using 2-symbol ECC in step 624, and the process of performing error correction is completed.

Figure 7:
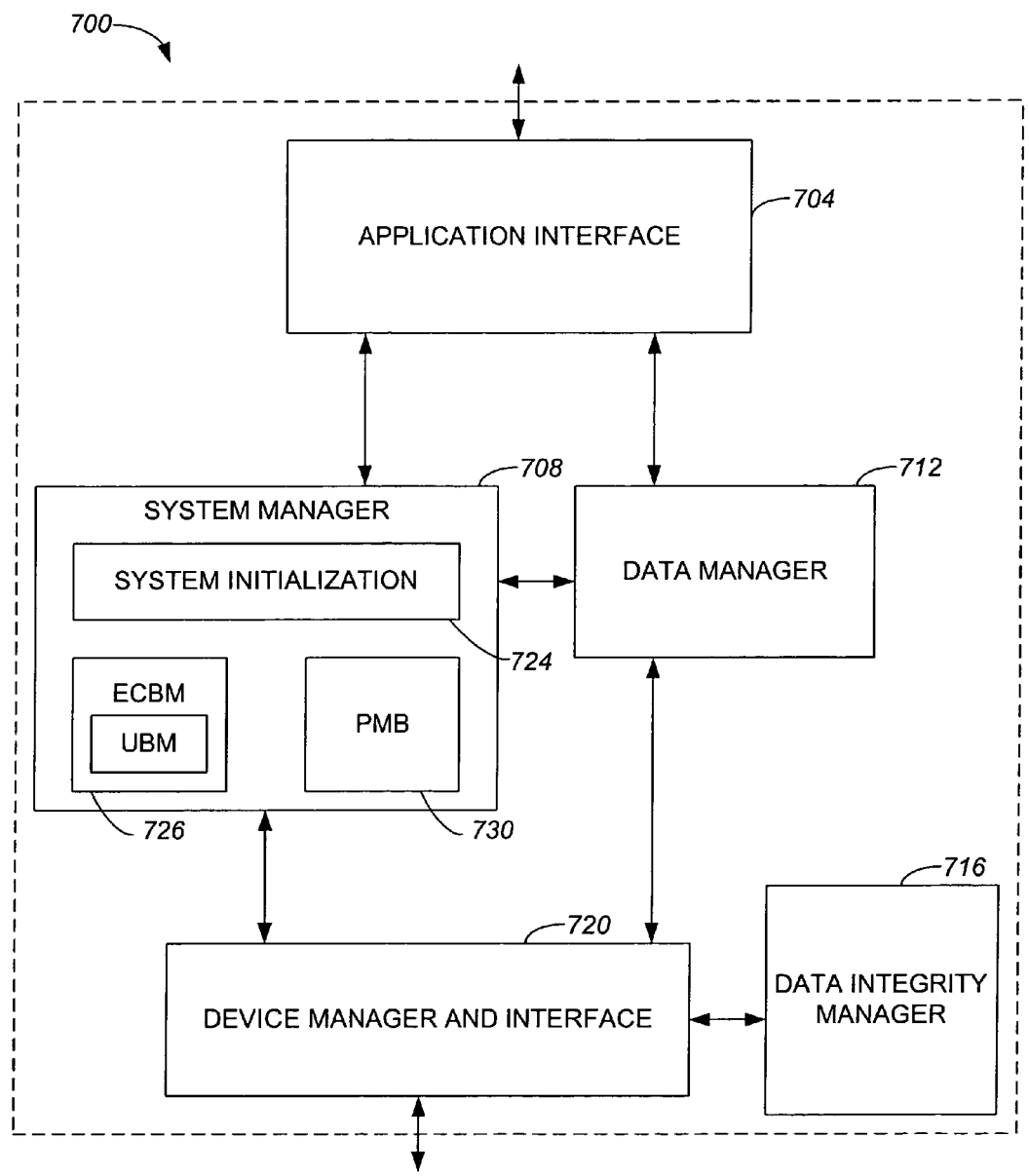
FIG. 7 is a diagrammatic block diagram representation of a system architecture in accordance with an embodiment of the present invention.

In general, the functionality associated with implementing, maintaining, and utilizing redundant areas which are dynamically configurable is provided in software, e.g., as program code devices, or as firmware to a host system which includes a non-volatile memory or non-volatile memory component. One embodiment of a suitable system architecture associated with the software or firmware provided to a host system to enable a hybrid mapping scheme to be implemented, maintained, and used is shown in FIG. 7. A system architecture 700 generally includes a variety of modules which may include, but are not limited to, an application interface module 704, a system manager module 708, a data manager module 712, a data integrity manager 716, and a device manager and interface module 720. In general, system architecture 700 may be implemented using software code devices or firmware which may be accessed by a processor, e.g., processor 108 of FIG. 2a.

In general, application interface module 704 may be arranged to communicate with the host, operating system or the user directly. Application interface module 704 is also in communication with system manager module 708 and data manager module 712. When the user want to read, write or format the flash memory, it send requests to the operating system, the requests are passed to the Application interface. The Application interface directs the requests to the system manager module 708 or data manager module 712 depending on the requests.

System manager module 708 includes a system initialization submodule 724, an erase count block management submodule 726, and a power management block submodule 730. System initialization submodule 724 is generally arranged to enable an initialization request to be processed, and typically communicates with erase count block management submodule 726. Erase count block management submodule 726 includes functionality to cause erase counts of blocks to be stored, and functionality to cause an average erase count to be calculated, as well as updated, using individual erase counts. The use of erase counts is described in co-pending U.S. patent application Ser. No. 10/281,739, which has been incorporated by reference in its entirety. System initialization module 724 is also arranged to resolve a one-to-many logical-to-physical block assignment and, hence, may utilize update indexes. Power management block submodule 730 may be arranged to enable a power management to be implemented, maintained, and used. By way of example, power management block submodule 730 may be arranged to allocate power management blocks, and to oversee the writing of signatures and other information which may be stored in a power management block.

In addition to being in communication with application interface module 704, system manager module 708 is also in communication with data manager module 712, as well as device manager and interface module 720. Data manager module 712, which communicates with both system manager module 708 and application interface module 704, may include functionality to provide sector mapping which effectively translates logical sectors into physical sectors. That is, data manager module 712 is arranged to map logical blocks into physical blocks. Data manager module 712 may also include functionality associated with operating system and file system interface layers, and enables groups within blocks to be managed, as described in co-pending U.S. patent application Ser. No. 10/281,855, which has been incorporated by reference in its entirety.

Device manager and interface module 720, which is in communication with system manager module 708, data manager 712, and data integrity manager 716, typically provides a flash memory interface, and includes functionality associated with hardware abstractions, e.g., an I/O interface. Data integrity manager module 716 provides ECC handling, among other functions.

Although only a few embodiments of the present invention have been described, it should be understood that the present invention may be embodied in many other specific forms without departing from the spirit or the scope of the present invention. By way of example, while reconfiguring a redundant area associated with a physical block has been described as being particularly suitable when an error correction method is to be changed, the redundant area may be configured or reconfigured at substantially any time.

An erase count has generally been described as being used as an indicator of when it may be appropriate to dynamically configure a redundant area of a physical block. For instance, when an erase count equals or exceeds a threshold, the implication may be that it is beneficial to change an error correction method by changing ECC bits stored in a redundant area. It should be appreciated, however, that the determination of when to change the error correction method used with respect to a physical block may be based on substantially any suitable criterion, and is not limited to being based on an erase count or a number of times the physical block has been erased. One suitable criterion may be an average erase count which is arranged to indicate an average number of times physical blocks within a system have been erased, as described in co-pending U.S. patent application Ser. No. 10/281,823, which has been incorporated by reference. When an average erase count reaches a particular value, redundant areas of substantially all physical blocks in use may be dynamically configured to alter the error correction methods used with respect to the physical blocks.

The steps associated with the various methods of the present invention may be widely varied. In general, steps may be added, removed, reordered, and altered without departing from the spirit or the scope of the present invention. By way of example, an erase count has been described as being obtained from a redundant area of a physical block. It should be appreciated, however, than an erase count may instead be obtained from an erase count block which stores erase counts. An erase count block is described in more detail in co-pending U.S. patent application Ser. No. 10/281,626, which has been incorporated by reference.

The error correction method indicated in the redundant area of a physical block has generally been described as using either a 1-bit ECC or a 2-symbol ECC. However, the error correction method indicated in the redundant area may vary widely. Further, the redundant area may be dynamically configured any number of times to update the error correction method used. For instance, although dynamic reconfiguration has been described as being used to change ECC bits in a redundant area from 1-bit ECC bits to 2-symbol ECC bits, dynamic reconfiguration may also change ECC bits from 1-bit ECC bits to 2-bit ECC bits and then to 2-symbol ECC bits.

Additionally, the actual ECC method or algorithms used may vary widely. Suitable ECC algorithms may include, but are not limited to, Reed-Solomon algorithms, Hamming code algorithms, and binary Hamming Code algorithms. For instance, in one embodiment, a suitable 1-bit ECC algorithm may be a Hamming code algorithm while a suitable 2-symbol ECC algorithm may be a Reed-Solomon algorithm. Therefore, the present examples are to be considered as illustrative and not restrictive, and the invention is not to be limited to the details given herein, but may be modified within the scope of the appended claims.

What is claimed is:

1. A method for dynamically configuring a redundant area of a page associated with a physical block of a non-volatile memory of a memory system, the method comprising:
    determining whether a predetermined metric value associated with performance of the non-volatile memory meets a predetermined criterion by checking one or more metric values stored in the non-volatile memory;
    storing at least one byte in the redundant area when the predetermined metric meets the predetermined criterion, the at least one byte corresponding to an error correction code (ECC) used by a first ECC algorithm to check for errors in the page;
    altering the at least one byte when the predetermined metric fails to meet the predetermined criterion, wherein the at least one altered byte corresponds to an ECC used by a second ECC algorithm to check for errors in the page, where the first ECC algorithm and the second ECC algorithm have differing computational costs.

2. The method of claim 1 wherein the first ECC algorithm is a one-bit ECC algorithm.

3. The method of claim 2, wherein the at least one byte comprises multiple bytes that include ECC information associated with the first ECC algorithm, and wherein the multiple bytes comprise:
    approximately three bytes used to correct an error associated with a first group of bytes of a data area of the page,
    approximately three bytes used to correct an error associated with a second group of bytes of the data area, and
    approximately two bytes used to correct an error associated with the redundant area.

4. The method of claim 2 wherein the second ECC algorithm is a 2-symbol ECC algorithm.

5. The method of claim 4 wherein the at least one byte comprises multiple bytes that include ECC information associated with the second ECC algorithm, and wherein the multiple bytes comprise:
    approximately five bytes used to correct at least one error associated with the data area of the page,
    approximately three bytes used to correct at least one error associated with the redundant area.

6. The method of claim 1 where the predetermined metric value is stored in the redundant area and indicates a number of times the physical block has been erased, wherein the predetermined metric value is compared to the predetermined criterion.

7. The method of claim 6 wherein the predetermined metric value includes a single bit corresponding to an erase count of the physical block, where a state of the single bit is used to compare an erase count with the predetermined criterion, and where the predetermined criterion includes a threshold value corresponding to a number of times that the physical block has been erased.

8. The method of claim 7 wherein the single bit is a digit of an erase counter used to determine a number of erase cycles undergone by the physical block.

9. The method of claim 1 wherein the non-volatile memory system is one of an embedded system, a Smart Media card, a Compact Flash card, a Secure Digital Card, and a MultiMedia card.

10. A memory system comprising:
    a non-volatile memory, the non-volatile memory including a physical block, wherein the physical block has a page with a data area and a redundant area;
    means for determining whether a predetermined metric associated with performance of the non-volatile memory meets a predetermined criterion by checking one or more metric values stored in the non-volatile memory;
    means for storing at least one byte in the redundant area when the predetermined metric meets the predetermined criterion, the at least one byte corresponding to an error correction code (ECC) used with a first ECC algorithm to check for errors in the page; and
    means for altering the at least one byte when the predetermined metric fails to meet the predetermined criterion, wherein the at least one altered byte corresponds to an ECC used with a second ECC algorithm to check for errors in the page, where the first ECC algorithm and the second ECC algorithm have differing computational costs.

11. The memory system of claim 10 wherein the first ECC algorithm is a 1-bit ECC algorithm and wherein the at least one byte comprises multiple bytes that include ECC information used by the first ECC algorithm, and wherein the multiple bytes comprise:
    approximately three bytes used to correct an error associated with a first group of bytes of a data area of the page,
    approximately three bytes used to correct an error associated with a second group of bytes of the data area, and
    approximately two bytes used to correct an error associated with the redundant area.

12. The memory system of claim 11 wherein the second ECC algorithm is a 2-symbol ECC algorithm, and wherein the at least one byte comprises multiple bytes that include ECC information used by the second ECC algorithm, and wherein the multiple bytes comprise:
    approximately five bytes used to correct at least one error associated with the data area of the page, and
    approximately three bytes used to correct at least one error associated with the redundant area.

13. The memory system of claim 10 further including:
    means for obtaining a value from the redundant area that corresponds to a number of times the physical block has been erased, and where the predetermined metric comprises a number of times the physical block has been erased.

14. The memory system of claim 10 wherein the non-volatile memory system is one of an embedded system, a Smart Media card, a Compact Flash card, a Secure Digital Card, and a MultiMedia card.

15. A method for processing a page associated with a physical block of a non-volatile memory of a memory system, the method comprising:
    determining whether at least one byte associated with a first error correction code (ECC) algorithm is to be altered for association with a second ECC algorithm based on whether a predetermined metric associated with performance of the non-volatile that is stored in a redundant area of the page meets a predetermined criterion, the at least one byte being stored in a redundant area associated with the page; and dynamically configuring the redundant area in response to the predetermined metric meeting or failing to meet the predetermined criterion such that the at least one byte is altered to be associated with the second ECC algorithm.

16. The method of claim 15 wherein the first ECC algorithm is a 1-bit ECC algorithm and the second ECC algorithm is a 2-symbol ECC algorithm.

17. The method of claim 16 wherein the at least one byte comprises multiple bytes associated with the first ECC algorithm, wherein the multiple bytes comprise:
approximately three bytes used to correct an error associated with a first group of byte of a data area of the page,
approximately three bytes used to correct an error associated with a second group of bytes of the data area, and
approximately two bytes arranged to be used to correct an error associated with the redundant area.

18. The method of claim 16 wherein the at least one byte comprises multiple bytes that are altered to be associated with the second ECC algorithm, and wherein the multiple bytes comprise:
approximately five bytes used to correct at least one error associated with the data area of the page, and
approximately three bytes used to correct at least one error associated with the redundant area.

19. The method of claim 15 wherein the predetermined metric comprises an indication of a number of times the physical block has been erased.

20. A method for dynamically configuring a redundant area of a page associated with a physical block of a non-volatile memory of a memory system, the method comprising:
determining whether a set of bits in the redundant area is to be altered based on whether a predetermined metric associated with performance of the non-volatile memory meets a predetermined criterion, where the redundant area includes information corresponding to the predetermined metric, the set of bits including error correction code (ECC) information associated with a first ECC algorithm, wherein the set of bits are substantially grouped in a first configuration for use by the first ECC algorithm; and
altering the set of bits responsive to determining that the predetermined metric meets the predetermined criterion, wherein the set of bits are altered to include ECC information associated with a second ECC algorithm, and substantially grouped in a second configuration for use by the second ECC algorithm.

21. The method of claim 20 wherein the set of bits includes approximately eighth bytes and the first configuration includes a first subset of approximately three bytes, a second subset of approximately three bytes, and a third subset of approximately two bytes.

22. The method of claim 21 wherein the second configuration includes a first grouping of approximately five bytes and a second grouping of approximately three bytes.

23. The method of claim 20 wherein the first ECC algorithm is a 1-bit ECC algorithm and the second ECC algorithm is a 2-symbol ECC algorithm.

24. The method of claim 20 wherein the predetermined metric comprises a number of times that the physical block has been erased.

25. A memory system comprising:
a non-volatile memory, the non-volatile memory including a physical block, where the physical block includes a page with a data area and a redundant area; and
a memory manager operable to
access a metric parameter value from the redundant area, where the metric parameter value corresponds to performance of the non-volatile memory,
compare the metric parameter value with a predetermined criterion,
store a first error correction code (ECC) in the redundant area of the page, where the first ECC is used by a first ECC algorithm when the metric parameter value meets the predetermined criterion, and
store a second ECC in the redundant area of the page, where the second ECC is used by a second ECC algorithm when the metric parameter value fails to meet the predetermined criterion, where the first and second ECC algorithms have different computational costs.

26. The memory system of claim 25, where the predetermined criterion comprises a number of times that the physical block has been erased.

27. The memory system of claim 26, where the first ECC algorithm has a lower computational cost than the second ECC algorithm, and where the second ECC algorithm is used when the number of times that the physical block has been erased exceeds a predetermined number.

28. The memory system of claim 27, where the memory manager comprises a counter that tracks the number of times that the physical block has been erased.

29. The memory system of claim 25, where the memory manager further operates to organize bits in the redundant area in a first configuration when the first ECC algorithm is employed, and to organize bits in the redundant area in a second configuration when the second ECC algorithm is employed.

30. A memory system comprising:
a non-volatile memory, the non-volatile memory including multiple physical blocks, where each of the physical blocks includes a page with a data area and a redundant area; and
a memory manager operable to
keep track of an average number of times that the multiple physical blocks of the non-volatile memory have been erased,
store a first error correction code (ECC) in the redundant area of a page, where the first ECC is used by a first ECC algorithm when the average number of times that the multiple physical blocks have been erased is less than a predetermined value, and
store a second ECC in the redundant area of the page, where the second ECC is used by a second ECC algorithm when the average number of times that the multiple physical blocks have been erased exceeds the predetermined value, where the first ECC algorithm has a lower computational cost than the second ECC algorithm.

31. The memory system of claim 30, where the memory manager further operates to organize bits in the redundant area in a first configuration when the first ECC algorithm is employed, and to organize bits in the redundant area in a second configuration when the second ECC algorithm is employed.

* * * * *